(12) United States Patent
Xing et al.

(10) Patent No.: US 10,460,677 B2
(45) Date of Patent: Oct. 29, 2019

(54) DISPLAY COMPONENTS AND CIRCUIT COMPONENTS OF DISPLAY DEVICES

(71) Applicant: Wuhan China Star Optoelectronics Technology Co., Ltd., Wuhan, Hubei (CN)

(72) Inventors: Zhenzhou Xing, Guangdong (CN); Chun-Hung Huang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 153 days.

(21) Appl. No.: 15/566,700

(22) PCT Filed: Sep. 21, 2017

(86) PCT No.: PCT/CN2017/102651
§ 371 (c)(1),
(2) Date: Oct. 14, 2017

(87) PCT Pub. No.: WO2019/024194
PCT Pub. Date: Feb. 7, 2019

(65) Prior Publication Data
US 2019/0049795 A1   Feb. 14, 2019

(51) Int. Cl.
*G09G 3/34* (2006.01)
*G02F 1/1335* (2006.01)
(Continued)

(52) U.S. Cl.
CPC ....... *G09G 3/342* (2013.01); *G02F 1/133611* (2013.01); *H05K 1/189* (2013.01);
(Continued)

(58) Field of Classification Search
CPC .............................. G09G 3/342; G09G 3/3426
See application file for complete search history.

(56) References Cited

U.S. PATENT DOCUMENTS

2008/0055231 A1* 3/2008 Nose .................... G09G 3/3406
345/102
2010/0103090 A1   4/2010 Baek
(Continued)

FOREIGN PATENT DOCUMENTS

CN          1877682 A     12/2006
CN        201812478 U      4/2011
(Continued)

*Primary Examiner* — Gene W Lee
(74) *Attorney, Agent, or Firm* — Andrew C. Cheng

(57) ABSTRACT

The present disclosure relates to a display component and a circuit component of display devices. The display component includes a display panel having a display area and an assembly area, a flexible circuit board, a display driving circuit configured within the assembly area or the flexible circuit board for processing the display signals so as to drive the backlight component of the display panel. One end of the flexible circuit board being fixed within the assembly area, and the other end of the flexible circuit board connecting to the host to input the display signals. With such configuration, the manufacturing efficiency of display components and display devices may be enhanced while the dynamic backlight adjustment may be realized.

13 Claims, 3 Drawing Sheets

(51) Int. Cl.
*H05K 1/18* (2006.01)
*G02F 1/1345* (2006.01)
(52) U.S. Cl.
CPC ............... *G02F 1/13452* (2013.01); *G02F 2001/133612* (2013.01); *G09G 2320/064* (2013.01)

(56) References Cited

U.S. PATENT DOCUMENTS

| | | |
|---|---|---|
| 2014/0118421 A1 | 5/2014 | Saitoh et al. |
| 2015/0371593 A1* | 12/2015 | Hesselmark ......... G09G 3/3413 345/440 |
| 2016/0005360 A1* | 1/2016 | Hwang ............... G09G 3/2092 345/690 |
| 2016/0189636 A1 | 6/2016 | Liu et al. |
| 2017/0193927 A1* | 7/2017 | Yang .................... G09G 3/3426 |
| 2017/0196076 A1 | 7/2017 | Chen et al. |
| 2018/0101043 A1 | 4/2018 | Chen et al. |

FOREIGN PATENT DOCUMENTS

| | | |
|---|---|---|
| CN | 103050108 A | 4/2013 |
| CN | 204596392 U | 8/2015 |
| CN | 106205547 A | 12/2016 |
| CN | 106652929 A | 5/2017 |

* cited by examiner

DISPLAY COMPONENTS AND CIRCUIT COMPONENTS OF DISPLAY DEVICES

BACKGROUND OF THE INVENTION

1. Field of the Invention

The present disclosure relates to liquid crystal display technology, and more particularly to a display component and a circuit component of display devices.

2. Discussion of the Related Art

With the continuous development of display technology, users demand toward display performance, resolution, and contrast of small and medium size LCD panels are getting higher and higher, which increases the applications of high dynamic range (HDR) technology.

With long development, it is found that, currently, the liquid crystal display module of the small and medium size LCD is connected to the host via a flexible circuit board. The main function of the host is to provide display signals to the liquid crystal display module and to provide backlight driving voltage to the backlight driving circuit arranged on the liquid crystal display module so as to turn on/off the backlight. However, the efficiency of the manufacturing process and the assembly process of such structure is low.

SUMMARY

The present disclosure relates to a display component and a circuit component of display devices to enhance the manufacturing efficiency of display components and display devices while the dynamic backlight adjustment may be realized.

In one aspect, a display component for displaying display signals obtained from a host includes: a display panel includes a display area, an assembly area, and a backlight component, the backlight component being configured within the assembly area; a flexible circuit board, one end of the flexible circuit board being fixed within the assembly area, and the other end of the flexible circuit board connecting to the host to input the display signals; a display driving circuit configured within the assembly area or the flexible circuit board for processing the display signals so as to drive the display area by the processed display signals; a backlight driving circuit configured within the assembly area or the flexible circuit board to obtain backlight dynamic adjustment signals from the display driving circuit, process the backlight dynamic adjustment signals, and to drive the backlight component of the display panel by the processed backlight dynamic adjustment signals; wherein the backlight component includes a plurality of emission sub-areas, each of the emission sub-areas corresponds to different areas of the display area, and the backlight dynamic adjustment signals are configured for separately turning on or off the emission areas or for adjusting a strength of light beams of the emission areas; the backlight dynamic adjustment signals being pulse width modulation (PWM) signals of a Content Adaptive Brightness Control (CABC) format.

In another aspect, a display component for displaying display signals obtained from a host includes: a display panel includes a display area, an assembly area, and a backlight component, the backlight component being configured within the assembly area; a flexible circuit board, one end of the flexible circuit board being fixed within the assembly area, and the other end of the flexible circuit board connecting to the host to input the display signals; a display driving circuit configured within the assembly area or the flexible circuit board for processing the display signals so as to drive the display area by the processed display signals; a backlight driving circuit configured within the assembly area or the flexible circuit board to obtain backlight dynamic adjustment signals from the display driving circuit, process the backlight dynamic adjustment signals, and to drive the backlight component of the display panel by the processed backlight dynamic adjustment signals.

In another aspect, a display component of display devices includes: a display panel configured to display displaying signals obtained from a host, the display panel further includes a display driving circuit and a backlight component, the circuit component includes: a flexible circuit board, one end of the flexible circuit board being fixed within the assembly area, and the other end of the flexible circuit board connecting to the host to input the display signals; a backlight driving circuit configured on the flexible circuit board to obtain backlight dynamic adjustment signals from the display driving circuit, process the backlight dynamic adjustment signals, and to drive the backlight component of the display panel by the processed backlight dynamic adjustment signals.

Compared to conventional technology, the backlight driving circuit arranged on the flexible circuit board obtains the backlight dynamic adjustment signals from the display driving circuit so as to drive the direct-lit backlight module of the display panel, which realizes the backlight dynamic adjustment. In addition, the backlight driving circuit is configured on the flexible circuit board such that the backlight driving circuit and the host may be configured to be separated from each other. With such configuration, the restrictions caused by different suppliers of the host and the display component may be eliminated so as to enhance the manufacturing process of the display component.

DETAILED DESCRIPTION OF THE EMBODIMENTS

Embodiments of the invention will now be described more fully hereinafter with reference to the accompanying drawings, in which embodiments of the invention are shown.

Figure 1:
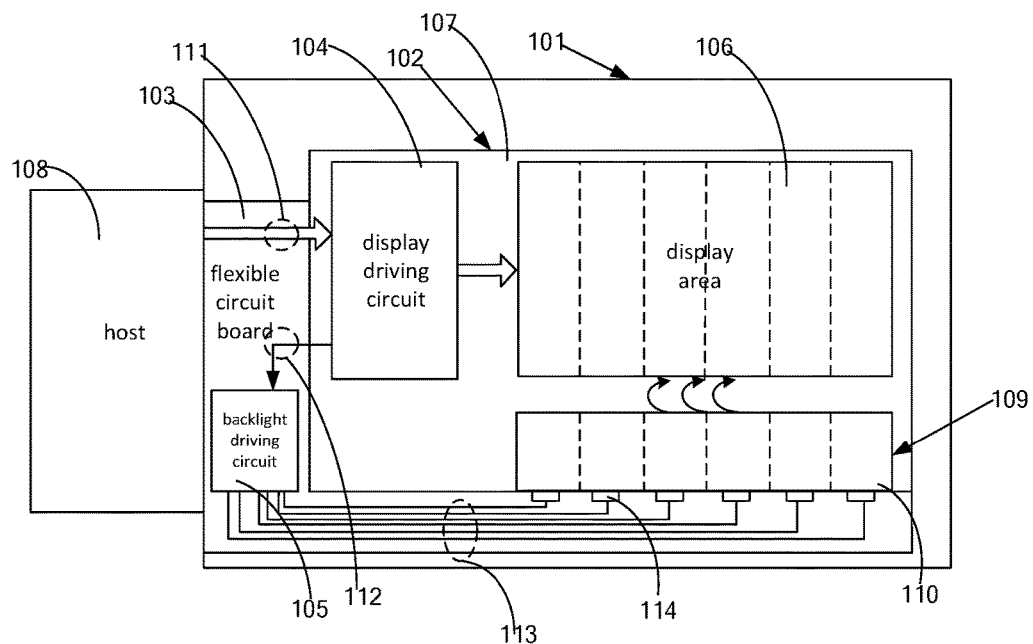
FIG. 1 is a schematic view of the display component in accordance with a first embodiment of the present disclosure.
Figure 2:
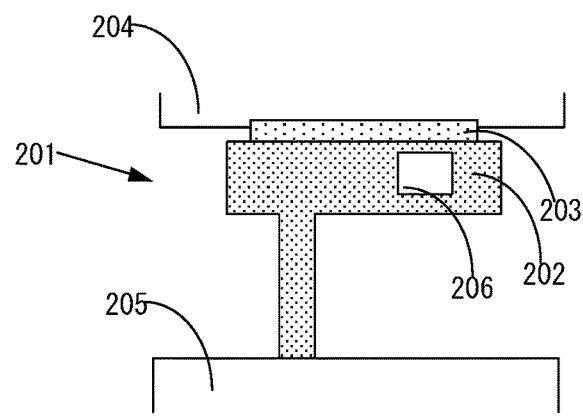
FIG. 2 is a schematic view of the flexible circuit board of the display component in accordance with one embodiment of the present disclosure.

FIG. 1 is a schematic view of the display component in accordance with a first embodiment of the present disclosure. FIG. 2 is a schematic view of the flexible circuit board of the display component in accordance with one embodiment of the present disclosure. A display component 101 includes a display panel 102, a flexible circuit board 103, a display driving circuit 104, and a backlight driving circuit 105. The display panel 102 includes a display area 106 and an assembling area 107. One end of the flexible circuit board 103 is fixed in the assembling area 107, and the other end of the flexible circuit board 103 connects to a host 108 to input display signals. The display driving circuit 104 is installed in the assembling area 107 to process the display signals such that the processed display signals may drive the display area 106. The backlight driving circuit 105 is arranged on the flexible circuit board 103 to obtain backlight dynamic adjustment signals from the display driving circuit 104 and to process the backlight dynamic adjustment signals. The backlight dynamic adjustment signals drive a backlight module 109 of the display panel 102. In one embodiment, the backlight module 109 is arranged on the assembling area 107.

It is to be noted that the processed display signals not only include the backlight dynamic adjustment signals, but also display driving signals and the display data signals for driving the display area 106.

The computer distinguishes the brightness of the image with an 8-bit (256) or 16-bit (65536) level when representing the image, but it is difficult to reproduce true natural light conditions with just a few hundred or tens of thousands of brightness levels. At present, the ordinary picture is composed of three primary colors—red, green and blue, which is for the cathode ray tube display. Through the combination of these three colors, any color can be displayed on the screen. The intensity of the color is within 256 gray units, that is, the normal image has only 0-255 gray scale per pixel, and the natural light color and intensity are not covered by the above specifications. For example, some very bright and very dark light cannot be expressed by the above specifications. In order to solve the above problem, the present embodiment shows that the display component 101 dynamically adjusts the backlight by the backlight driving circuit 105, and the gradation range of the image can be enlarge. As such, the display effect of the image display can be improved.

During the manufacturing process of the display device, generally, the display component 101 and the host 108 are manufactured by different suppliers. The manufacturing process of the display device may affected while a portion of the components of the display component 101, such as the backlight driving circuit 105, are configured to a lateral side of the host 108. Due to different manufacturing rules of different suppliers, the complexity of the assembly and the tuning process of the display component 101 and the host 108 may be increased.

In one embodiment, the display driving circuit 104 and the backlight driving circuit 105 are configured on one lateral side of the display area 106 closer to the host 108 than the other lateral side. In other embodiments, the display driving circuit 104 and the backlight driving circuit 105 may be configured on different lateral sides of the display area 106. With respect to direct-lit backlight module 109, the display driving circuit 104 and the backlight driving circuit 105 may be configured on different layers.

Compared to conventional technology, the backlight driving circuit 105 arranged on the flexible circuit board 103 obtains the backlight dynamic adjustment signals from the display driving circuit 104 so as to drive the direct-lit backlight module 109 of the display panel 102, which realizes the backlight dynamic adjustment. In addition, the backlight driving circuit 105 is configured on the flexible circuit board 103 such that the backlight driving circuit 105 and the host 108 may be configured to be separated from each other. With such configuration, the restrictions caused by different suppliers of the host 108 and the display component 101 may be eliminated so as to enhance the manufacturing process of the display component 101.

In one example, the backlight dynamic adjustment signals of the display component 101 may be pulse width modulation (PWM) signals of Content Adaptive Brightness Control (CABC) format. In other embodiments, the CABC format may be replaced by Light Adaptive Brightness Control (LABC) or other formats.

In one example, the direct-lit backlight module 109 may include a plurality of emissive sub-areas 110. Each of the emissive sub-areas 110 corresponds to different areas of the display area 106. The backlight dynamic adjustment signals may be adopted to solely configure the emissive sub-areas 110, such as the strength of the emission. As such, the backlight brightness may be enhanced so as to enlarge the grayscale range of images.

In one example, the flexible circuit board 103 is configured with a first signal transmission line 111, second signal transmission lines 112, a backlight driving line 113, and a backlight driving interface 114. One end of the first signal transmission line 111 connects to the host 108, and the other end of the host 108 connects to the display panel 102 and to the display driving circuit 104 for transmitting the display signals. One end of the second signal transmission line 112 connects to the display panel 102, and the other end of the second signal transmission line 112 connects to the backlight driving circuit 105. The number of the second signal transmission lines 112 is the same with the number of the emissive sub-areas 110, and each of the second signal transmission lines 112 connects to one corresponding emissive sub-area 110 for transmitting the backlight dynamic adjustment signals. The backlight driving line 113 connects between the backlight driving circuit 105 and the backlight driving interface 114. The backlight driving interface 114 engages with the direct-lit backlight module 109.

In one embodiment, the number of the backlight driving line 113 is the same with the number of the backlight driving interface 114, and the backlight dynamic adjustment signals are transmitted by a parallel manner. In other embodiments, one backlight driving line 113 may be connected serially to transmit the backlight dynamic adjustment signals to all of the backlight driving interface 114. It can be understood that the backlight dynamic adjustment signals may be transmitted by partially serial connection and partially parallel connection.

FIG. 2 is a schematic view of the flexible circuit board of the display component in accordance with one embodiment of the present disclosure. The flexible circuit board 201 includes a component carrier portion 202 and a connection portion 203 connected together. One end of the connection portion 203 connects to an assembly area 204, and the other end of the connection portion 203 connects to a first end of the component carrier portion 202, and a second end of the component carrier portion 202 connects to a host 205. The IC chip 206 is configured within the component carrier portion 202.

In one scenario, the component carrier portion 202 of the flexible circuit board 201 is T-shaped. In an example, the T-shaped component carrier portion 202 is configured with only one signal transmission line (not shown) such that the host 205 transmits the display signals to the display driving circuit (not shown). The backlight driving circuit 206 may connect to the display driving circuit via the connection portion 203, instead of configuring other transmission lines between the backlight driving circuit 20 and the display driving circuit. As such, the dimension of the flexible circuit board 201 may be decreased so as to simplify the structure of the flexible circuit board 201.

Figure 3:
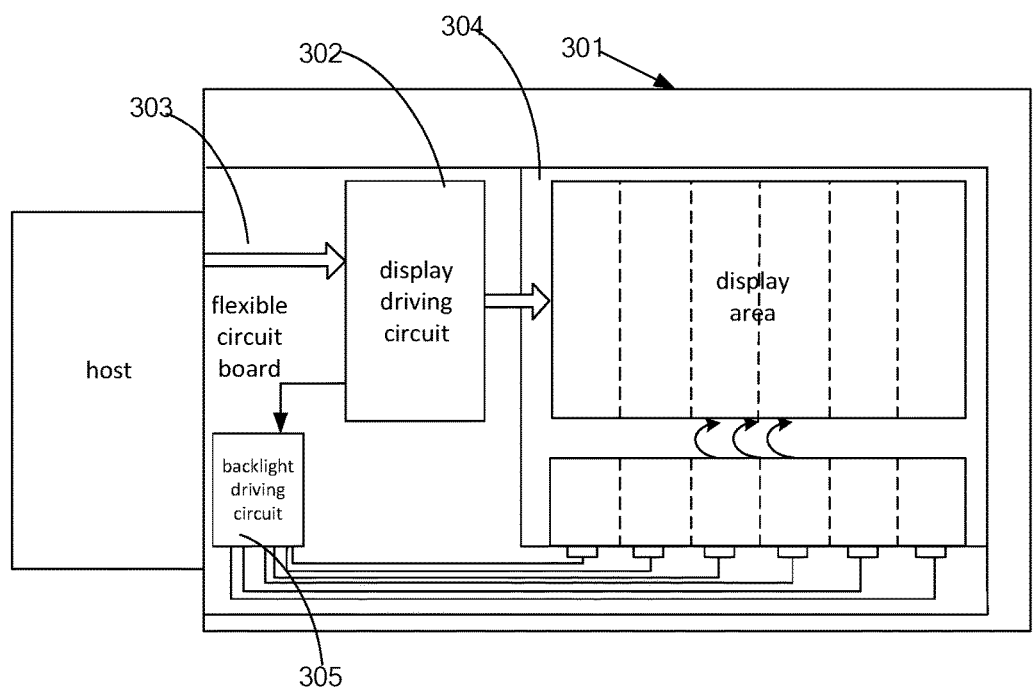
FIG. 3 is a schematic view of the display component in accordance with a second embodiment of the present disclosure.

FIG. 3 is a schematic view of the display component in accordance with a second embodiment of the present disclosure. With respect to a display component 301, the CF substrate 302 is configured on the flexible circuit board 303 so as to reduce the dimension of the assembly area 304. In other embodiments, the display driving circuit 302 may be configured on the flexible circuit board 303 such that the LEDs 305 may be arranged within the assembly area 304. In another example, the display driving circuit 302 and the LEDs 305 may be arranged within the assembly area 304.

Figure 4:
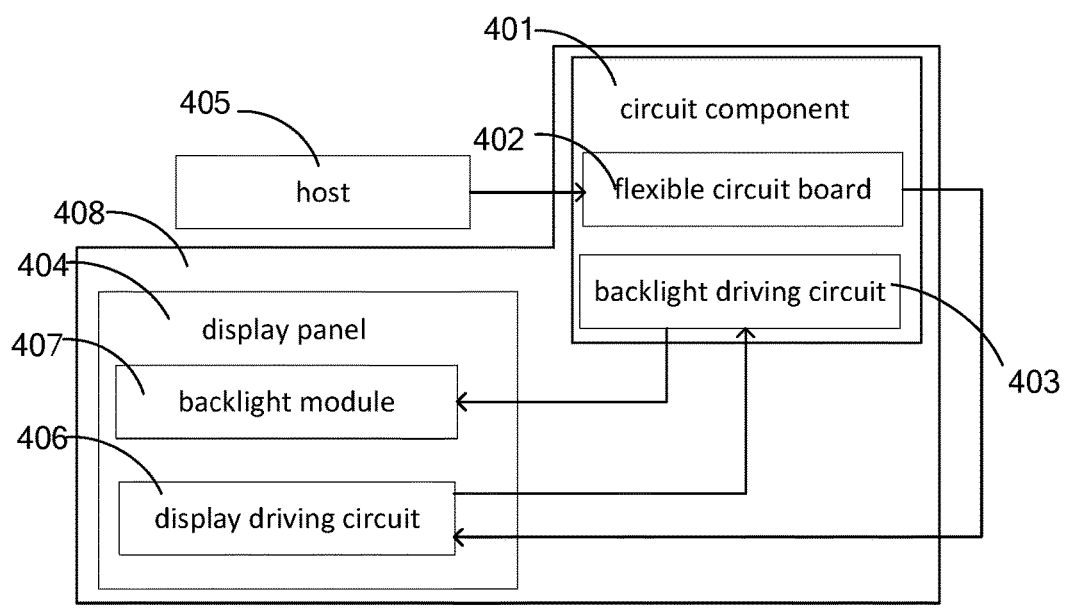
FIG. 4 is a schematic view of the display component of the display device in accordance with one embodiment of the present disclosure.

FIG. 4 is a schematic view of the display component of the display device in accordance with one embodiment of the present disclosure. The circuit component 401 includes a flexible circuit board 402 and a backlight driving circuit 403. One end of the flexible circuit board 402 is fixed on a display panel 404 (referring to FIG. 1), and the other end of the flexible circuit board 402 connects to the host 405 to input display signals to the display driving circuit 406 for driving the display panel 404. The backlight driving circuit 403 is arranged on the flexible circuit board 402 to obtain the backlight dynamic adjustment signals from the display driving circuit 406 and to process the backlight dynamic adjustment signals. The backlight dynamic adjustment signals are configured for driving the backlight module 407 of the display panel 404. In view of the above, the circuit component 401 and the display panel 404 cooperatively form the display device 408. The display panel 404 is configured for obtain the display signals from the host 405. The display panel 404 further includes the display driving circuit 406 and the backlight module 407.

In view of the above, the backlight driving circuit 403 arranged on the flexible circuit board 402 obtains the backlight dynamic adjustment signals from the display driving circuit 406 so as to drive the direct-lit backlight module 407 of the display panel 404, which realizes the backlight dynamic adjustment. In addition, the backlight driving circuit 403 is configured on the flexible circuit board 402 such that the backlight driving circuit 403 and the host 405 may be configured to be separated from each other. With such configuration, the restrictions caused by different suppliers of the host 405 and the display component 401 may be eliminated so as to enhance the manufacturing process of the display component 401.

In one example, the backlight dynamic adjustment signals of the display component 401 may be pulse width modulation (PWM) signals of Content Adaptive Brightness Control (CABC) format. In other embodiments, the CABC format may be replaced by Light Adaptive Brightness Control (LABC) or other formats.

In one example, the direct-backlight module 407 may include a plurality of emissive sub-areas (not shown, but may refer to FIG. 1). Each of the emissive sub-areas corresponds to different areas of the display area. The backlight dynamic adjustment signals may be adopted to solely configure the emissive sub-areas, such as the strength of the emission. As such, the backlight brightness may be enhanced so as to enlarge the grayscale range of images.

The structure and the operation principle of the flexible circuit board 402 may be referenced in the above embodiments, and the expansion of the circuit component 401 may be similar to that of the display component as described in the above.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display component for displaying display signals obtained from a host, comprising:
   a display panel comprising a display area, an assembly area, and a backlight component, the backlight component being configured within the assembly area;
   a flexible circuit board, one end of the flexible circuit board being fixed within the assembly area, and the other end of the flexible circuit board connecting to the host to input the display signals;
   a display driving circuit configured within the flexible circuit board for processing the display signals so as to drive the display area by the processed display signals;
   a backlight driving circuit configured within the assembly area or the flexible circuit board to obtain backlight dynamic adjustment signals from the display driving circuit, process the backlight dynamic adjustment signals, and to drive the backlight component of the display panel by the processed backlight dynamic adjustment signals;
   wherein the backlight component comprises a plurality of emission sub-areas, each of the emission sub-areas corresponds to different areas of the display area, and the backlight dynamic adjustment signals are configured for separately turning on or off the emission areas or for adjusting a strength of light beams of the emission areas;
   the backlight dynamic adjustment signals being pulse width modulation (PWM) signals of a Content Adaptive Brightness Control (CABC) format;
   wherein the flexible circuit board comprises a component carrier portion and a connection portion, one end of the connection portion connects to an assembly area, and the other end of the connection portion connects to a first end of the component carrier portion, and a second end of the component carrier portion connects to a host;
   the backlight driving circuit is configured within the component carrier portion;
   wherein the component carrier portion is T-shaped.

2. The display component as claimed in claim 1, wherein the flexible circuit board is configured with a first signal transmission line, second signal transmission lines, a backlight driving line, and a backlight driving interface;
   one end of the first signal transmission line connects to a host, and the other end of the first signal transmission line connects to the display panel and to the display driving circuit for transmitting the display signals;
   one end of the second signal transmission line connects to the display panel, and the other end of the second signal transmission line connects to the backlight driving circuit, a number of the second signal transmission lines is the same with the number of the emissive sub-areas, and each of the second signal transmission lines connects to one corresponding emissive sub-area for transmitting the backlight dynamic adjustment signals;
   the backlight driving line connects between the backlight driving circuit and the backlight driving interface, and the backlight driving interface engages with a backlight module.

3. The display component as claimed in claim 1, wherein the display driving circuit and the backlight driving circuit are arranged on the same side of the display area closer to the host than the other side of the display area.

4. A display component for displaying display signals obtained from a host, comprising:
- a display panel comprising a display area, an assembly area, and a backlight component, the backlight component being configured within the assembly area;
- a flexible circuit board, one end of the flexible circuit board being fixed within the assembly area, and the other end of the flexible circuit board connecting to the host to input the display signals;
- a display driving circuit configured within the flexible circuit board for processing the display signals so as to drive the display area by the processed display signals;
- a backlight driving circuit configured within the assembly area or the flexible circuit board to obtain backlight dynamic adjustment signals from the display driving circuit, process the backlight dynamic adjustment signals, and to drive the backlight component of the display panel by the processed backlight dynamic adjustment signals;
- wherein the flexible circuit board comprises a component carrier portion and a connection portion, one end of the connection portion connects to an assembly area, and the other end of the connection portion connects to a first end of the component carrier portion, and a second end of the component carrier portion connects to a host;
- the backlight driving circuit is configured within the component carrier portion;
- wherein the component carrier portion is T-shaped.

5. The display component as claimed in claim 4, wherein the backlight component comprises a plurality of emission sub-areas, each of the emission sub-areas corresponds to different areas of the display area, and the backlight dynamic adjustment signals are configured for separately turning on or off the emission areas or for adjusting a strength of light beams of the emission areas.

6. The display component as claimed in claim 5, wherein the flexible circuit board is configured with a first signal transmission line, second signal transmission lines, a backlight driving line, and a backlight driving interface;
- one end of the first signal transmission line connects to a host, and the other end of the first signal transmission line connects to the display panel and to the display driving circuit for transmitting the display signals;
one end of the second signal transmission line connects to the display panel, and the other end of the second signal transmission line connects to the backlight driving circuit, a number of the second signal transmission lines is the same with the number of the emissive sub-areas, and each of the second signal transmission lines connects to one corresponding emissive sub-area for transmitting the backlight dynamic adjustment signals;
- the backlight driving line connects between the backlight driving circuit and the backlight driving interface, and the backlight driving interface engages with a backlight module.

7. The display component as claimed in claim 4, wherein the backlight dynamic adjustment signals are pulse width modulation (PWM) signals of a Content Adaptive Brightness Control (CABC) format.

8. The display component as claimed in claim 4, wherein the display driving circuit and the backlight driving circuit are arranged on the same side of the display area closer to the host than the other side of the display area.

9. A circuit component of display devices, comprising:
- a display panel configured to display displaying signals obtained from a host, the display panel further comprising a display driving circuit and a backlight component, the circuit component comprising:
- a flexible circuit board, one end of the flexible circuit board being fixed within the assembly area, and the other end of the flexible circuit board connecting to the host to input the display signals;
- a backlight driving circuit configured within the flexible circuit board to obtain backlight dynamic adjustment signals from the display driving circuit, process the backlight dynamic adjustment signals, and to drive the backlight component of the display panel by the processed backlight dynamic adjustment signals;
- wherein the flexible circuit board comprises a component carrier portion and a connection portion, one end of the connection portion connects to an assembly area, and the other end of the connection portion connects to a first end of the component carrier portion, and a second end of the component carrier portion connects to a host;
- the backlight driving circuit is configured within the component carrier portion;
- wherein the component carrier portion is T-shaped.

10. The circuit component as claimed in claim 9, wherein:
- the backlight driving circuit comprises a plurality of output ends corresponding to a plurality of emission sub-areas of the backlight component, wherein the backlight component is configured for separately turning on or off the emission areas or for adjusting a strength of light beams of the emission areas.

11. The circuit component as claimed in claim 10, wherein:
- the flexible circuit board is configured with a first signal transmission line, second signal transmission lines, a backlight driving line, and a backlight driving interface;
- one end of the first signal transmission line connects to a host, and the other end of the first signal transmission line connects to the display panel and to the display driving circuit for transmitting the display signals;
- one end of the second signal transmission line connects to the display panel, and the other end of the second signal transmission line connects to the backlight driving circuit, a number of the second signal transmission lines is the same with the number of the emissive sub-areas, and each of the second signal transmission lines connects to one corresponding emissive sub-area for transmitting the backlight dynamic adjustment signals;
- the backlight driving line connects between the backlight driving circuit and the backlight driving interface, and the backlight driving interface engages with a backlight module.

12. The circuit component as claimed in claim 9, wherein the backlight dynamic adjustment signals are pulse width modulation (PWM) signals of a Content Adaptive Brightness Control (CABC) format.

13. The circuit component as claimed in claim 9, wherein the display driving circuit and the backlight driving circuit are arranged on the same side of the display area closer to the host than the other side of the display area.

* * * * *